(12) United States Patent
Chuang et al.

(10) Patent No.: US 9,543,153 B2
(45) Date of Patent: Jan. 10, 2017

(54) RECESS TECHNIQUE TO EMBED FLASH MEMORY IN SOI TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Kai-Shyang You, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 127 days.

(21) Appl. No.: 14/332,556

(22) Filed: Jul. 16, 2014

(65) Prior Publication Data

US 2016/0020219 A1 Jan. 21, 2016

(51) Int. Cl.
| | |
|---|---|
| *H01L 21/265* | (2006.01) |
| *H01L 27/115* | (2006.01) |
| *H01L 29/423* | (2006.01) |
| *H01L 29/51* | (2006.01) |
| *H01L 29/06* | (2006.01) |
| *H01L 29/49* | (2006.01) |
| *H01L 21/28* | (2006.01) |
| *H01L 27/12* | (2006.01) |

(52) U.S. Cl.
CPC ....... *H01L 21/265* (2013.01); *H01L 21/28017* (2013.01); *H01L 21/28282* (2013.01); *H01L 27/11573* (2013.01); *H01L 27/1207* (2013.01); *H01L 29/0649* (2013.01); *H01L 29/42344* (2013.01); *H01L 29/495* (2013.01); *H01L 29/4966* (2013.01); *H01L 29/513* (2013.01); *H01L 29/518* (2013.01)

(58) Field of Classification Search
CPC ............ H01L 27/1207; H01L 27/11573; H01L 21/265; H01L 21/28017; H01L 21/28282
See application file for complete search history.

(56) References Cited

U.S. PATENT DOCUMENTS 6,555,891 B1 * 4/2003 Furukawa ......... H01L 21/76262
257/347
6,835,981 B2 * 12/2004 Yamada ............ H01L 21/76264
257/347

(Continued)

OTHER PUBLICATIONS

Shigeru Shimauchi, "SoC Differentiation using FD-SOI—A Manufacturing Partner's Perspective," FD-SOI Industry Consortium Workshop 2013, p. 3, Jun. 15, 2013.

*Primary Examiner* — Allison P Bernstein
(74) *Attorney, Agent, or Firm* — Eschweiler & Associates, LLC

(57) ABSTRACT

An integrated circuit arranged on a silicon-on-insulator (SOI) substrate region is provided. The SOI substrate region is made up of a handle wafer region, an oxide layer arranged over the handle wafer region, and a silicon layer arranged over the oxide layer. A recess extends downward from an upper surface of the silicon layer and terminates in the handle wafer region, thereby defining a recessed handle wafer surface and sidewalls extending upwardly from the recessed handle wafer surface to meet the upper surface of the silicon layer. A first semiconductor device is disposed on the recessed handle wafer surface. A second semiconductor device is disposed on the upper surface of the silicon layer.

20 Claims, 6 Drawing Sheets

(56) References Cited

U.S. PATENT DOCUMENTS

| | | | | |
|---|---|---|---|---|
| 7,888,729 B2 * | 2/2011 | Cheng | ............... | H01L 29/66825 257/314 |
| 8,350,331 B2 * | 1/2013 | Tsujiuchi | ................ | H01L 21/84 257/213 |
| 8,809,179 B2 * | 8/2014 | Wang | .................... | H01L 27/105 257/E27.078 |
| 8,901,632 B1 * | 12/2014 | Perera | ................. | H01L 29/7831 257/314 |
| 8,962,418 B2 * | 2/2015 | Hoshino | ............ | H01L 27/1203 438/149 |
| 2014/0353756 A1 * | 12/2014 | Yamamoto | .......... | H01L 27/1203 257/351 |

* cited by examiner though the patent could be bulk silicon, where the flash memory device is formed on a bulk silicon substrate.

RECESS TECHNIQUE TO EMBED FLASH MEMORY IN SOI TECHNOLOGY

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
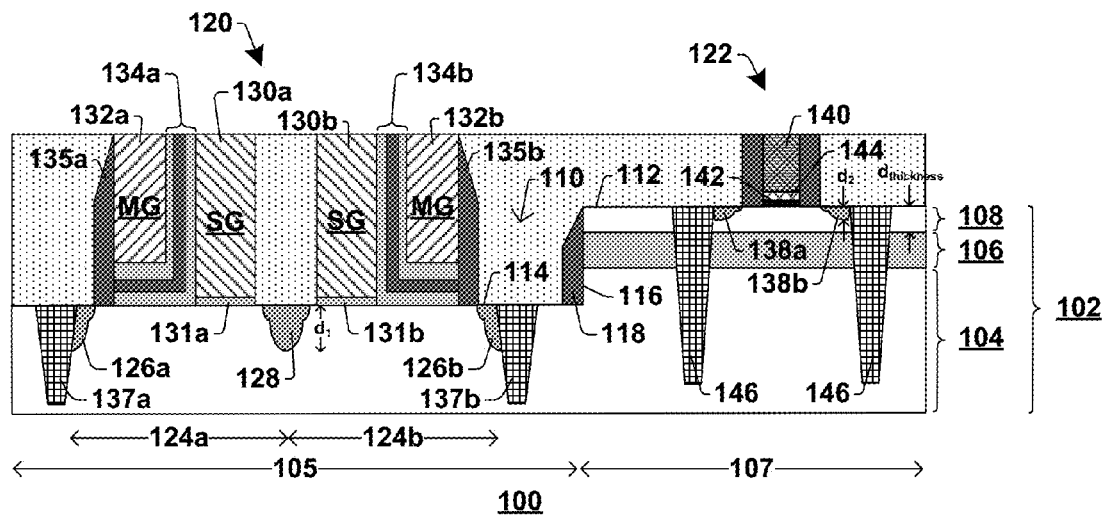
FIG. 1 illustrates an integrated circuit which includes a flash memory device on a recessed handle wafer surface and which includes a logic device to control the flash memory device on an upper device surface.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory is traditionally formed on a bulk silicon substrate and uses various bias conditions to read and write data values. For example, an EFS3 cell—or so-called "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). Each cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "1") for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "0") for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "0" is read). If the memory cell device does not turn on, then it is deemed to contain a second data state (e.g., a logical "1" is read).

Due to the high-voltages involved in performing program and/or erase operations, high energy implants are used in some instances to form the source/drain regions of the flash memory cells. Thus, the source/drain regions of the flash cells can be implanted deeper than that of standard low-voltage CMOS devices. This additional implant depth can help to reduce current crowding at the substrate surface near edges of the source/drain regions. Unfortunately, however, as more advanced process technologies are tending to use silicon-on-insulator (SOI) wafers more regularly, this source/drain depth can be a problem. In particular, SOI wafers are made up of a so-called "handle wafer" (which is used as a support structure), and a so-called "device wafer" (which is made of high quality semiconductor material), and an insulator layer such as silicon dioxide separating the handle wafer from the device wafer. In some instances, to help with current crowding or other high-voltage concerns, it would be desirable to implant the source/drains at a depth that is greater than the thickness of the device wafer. However, in current SOI techniques, performing such an implantation would result in the dopants being implanted into the buried insulator layer of the SOI wafer, which would not result in the intended benefits due to the insulating (i.e., non-conducting) properties of the buried insulator layer.

Accordingly, some embodiments of the present disclosure relate to flash memory devices that are formed on a recessed region of an SOI wafer. In particular, this recessed region of the SOI wafer is recessed such that the source/drain regions of the flash devices are formed in a handle wafer region of the SOI substrate, rather than being formed in the device wafer of the SOI substrate. Because the handle wafer region of this SOI wafer is thicker than the device wafer region, the source/drain regions can be implanted more deeply to mitigate high voltage issues. At the same time, these flash memory devices (which can be formed with deeper source/drain regions in the recessed handle wafer region) can be integrated with CMOS devices or other logic circuits (which have shallower source/drain regions that are formed on the non-recessed device wafer). This integration thus promotes good tradeoffs which can be beneficial for some modern process technologies. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

Turning to FIG. 1, one can see a cross-sectional view of an integrated circuit (IC) 100 formed on an SOI substrate 102 in accordance with some embodiments. The SOI substrate 102 is made up of a handle wafer region 104, an insulating layer 106 arranged over the handle wafer region 104, and a high quality semiconductor device layer 108 arranged over the insulating layer 106. Typically, the handle wafer region 104 is thicker than the device layer 108, and both the handle wafer region 104 and device layer 108 are made of silicon. The insulating layer 106 typically comprises silicon dioxide, although other dielectric materials are also possible. The illustrated SOI wafer 102 is illustrated as generally having a memory region 105 and a logic region 107, which can be arranged around a periphery of the memory region 105.

A recess 110 extends downward from an upper device layer surface 112 and defines a recessed handle wafer surface 114 and sidewalls 116, which extend upwardly from the recessed handle wafer surface 114 to meet the upper silicon layer surface 112. A dielectric spacer 118 is arranged on the recess sidewalls 116 and extends vertically from over the recessed handle wafer surface 114 past the insulating layer 106 and alongside the silicon layer 108. Thus, the recessed handle wafer surface 114 corresponds generally to the memory region 105 where an array of memory devices is arranged, while an upper device layer surface 112 corresponds generally to the logic region 107 where a memory array control circuit is arranged.

A first semiconductor device 120, such as a memory device, is disposed in the memory region on the recessed handle wafer surface 114, and a second semiconductor device 122, such as a logic device in the form of a CMOS transistor, is disposed in the logic region 107 on the upper silicon layer surface 112. In the example illustrated in FIG. 1, first semiconductor device 120 is a non-volatile memory (NVM) device in the form of a split gate flash cell, and the second semiconductor device 122 is a high-k metal gate device, however other semiconductor devices are also contemplated as falling within the scope of this disclosure. In some embodiments, the first semiconductor device 120 and second semiconductor device 122 operate with different bias voltages, and have different source/drain depths to limit surface current crowding for the higher voltage device. Further, in some embodiments, the first and second semiconductor devices have respective gate top surfaces that are co-planar. This co-planarity allows for efficient planarization during processing.

The illustrated first semiconductor device 120, which manifests as a non-volatile memory (NVM) device, includes a pair of split gate cells—namely a first NVM cell 124a and a second NVM cell 124b. The NVM cells each include an individual NVM source/drain region (e.g., 124a, 124b) and share a common source/drain region 128. The individual source/drain regions 126a 126b and common source/drain region 128 are spaced apart from one another in the handle wafer 104. The NVM cells also include respective select gates (SG) 130a, 130b which are disposed over the recessed handle wafer surface 114 and which are arranged between the common NVM source/drain and the individual NVM source/drain regions. Gate dielectric 131a, 131b separates the SGs from the recessed handle wafer surface 114. Memory gates (MG) 132a, 132b are disposed between respective SG sidewalls and the individual NVM source/drain regions 126a, 126b, respectively. A charge trapping layer 134a, 134b (such as a layer of spherical-shaped Si dots sandwiched between a control oxide layer and a tunnel oxide layer, or a oxide-nitride-oxide (ONO) charge trapping layer) is arranged between neighboring sidewalls of the SGs and MGs (130a-132a, and 130b-132b, respectively) and extends under the respective MGs 132a, 132b to separate the MGs from the recessed handle wafer surface 114. Sidewall dielectric spacers 135a, 135b, and isolation regions 137a, 137b can also be present.

The illustrated second semiconductor device 122, which manifests as a high-k metal gate (HKMG) device, includes a pair of HKMG source/drain regions 138a, 138b which are spaced apart from one another in the silicon layer 108. A metal gate 140 is disposed over the silicon layer 108 and is arranged between the pair of HKMG source/drain regions 138a, 138b, and is separated from the silicon layer 108 by a high-k gate dielectric 142 and an oxide and/or etch stop layer 144. Isolation regions 146, which in some embodiments can extend down into the handle wafer 104, are also present to provide electrical isolation between neighboring HKMG devices. A top surface of the HKMG metal gate 140 is co-planar with a top surface of the SG 130a'/130b' and/or a top surface of the MG 132a', 132b'.

In some embodiments, the NVM source/drain regions 126a, 126b, 128 have a first implant depth, $d_1$, and the HKMG source/drain regions 138a, 138b have a second implant depth, $d_2$, which is greater than the first implant depth, $d_1$. Further, the first implant depth $d_1$, as measured between the recessed handle wafer surface 114 and a lowermost portion of the NVM source/drain regions 126a, 126b, 128, is greater than a thickness, $d_{thickness}$, of the handle wafer region 104, as measured between the upper device layer surface 112 and an uppermost surface of the insulating layer 106, in some embodiments. This additional depth can help to limit surface current crowding for the flash memory cells 124a, 124b during high voltage operating modes.

Figure 2:
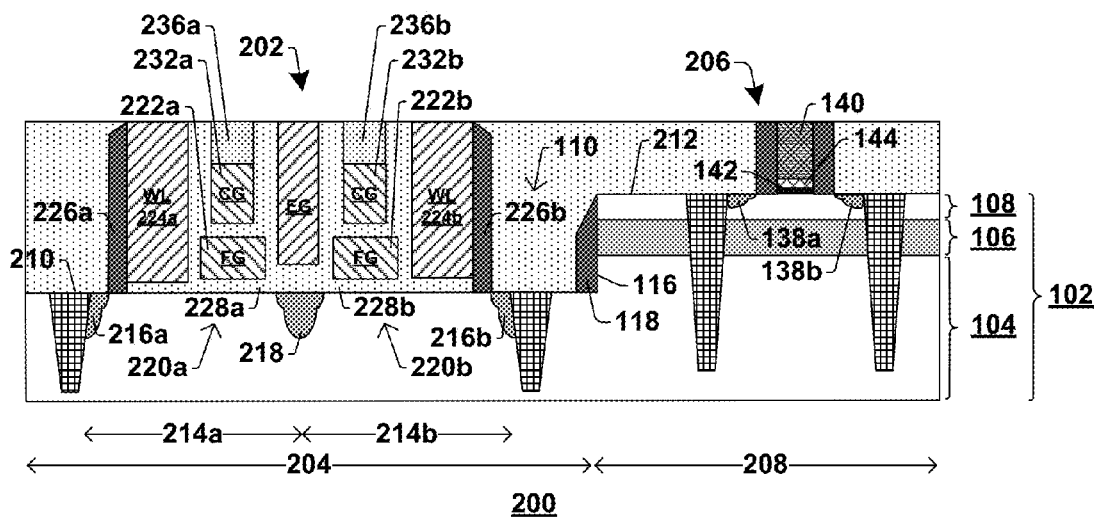
FIG. 2 illustrates another embodiment of an integrated circuit which includes a flash memory device on a recessed handle wafer surface and which includes a logic device to control the flash memory device on an upper device surface.

FIG. 2 illustrates a cross-sectional view of another embodiment of an integrated circuit 200, which includes another example of an NVM memory cell 202 arranged in memory region 204 and another transistor 206 arranged in logic region 208. In particular, the NVM memory cell 202 manifests as an ESF3 split gate flash memory cell device formed on recessed wafer surface 210 while the transistor 206 supports operation of the NVM memory cell 202 and is formed on upper device layer surface 212. Transistor 206 is illustrated and described below, for example, as a high-k metal gate transistor.

Like the flash memory cell of FIG. 1, FIG. 2's ESF3 split gate flash memory cell 202 includes first and second memory cells 214a, 214b arranged in memory region 204. The memory cells 214a, 214b include individual source/drain regions 216a, 216b, respectively, and a common source/drain region 218. The individual source/drain regions 216a, 216b and common source/drain region 218 are separated by channel regions 220a, 220b. Over the channel regions, the memory cell devices include respective floating gates 222a, 222b and word lines 224a, 224b spaced between the source/drain regions of the individual cell 214a, 214b. Word line spacers 226a, 226b extend vertically up along sidewalls of the word lines. The floating gates 222a, 222b and the word lines 224a, 224b are, for example, polysilicon, and the word line spacers 226a, 226b are, for example, silicon nitride.

Arranged between the handle wafer 104 and the floating gates 222a, 222b, floating gate dielectrics 228a, 228b provide electrical isolation between the handle wafer and the floating gates 222a, 222b. Further, arranged between the word lines 224a, 224b and the handle wafer 104, word line dielectrics 230a, 230b provide electrical isolation between the handle wafer 104 and the word lines 224a, 224b. The floating gates dielectrics 228a, 228b and the word line dielectrics 230a, 230b are, for example, silicon dioxide, oxide-nitrides, high-k dielectrics, or the like.

Control gates 232a, 232b are arranged over the top surface of the floating gates 222a, 222b, respectively; and control gate dielectrics are arranged between the control gates 232a, 232b and the floating gates 222a, 222b. The control gate dielectrics electrically isolate the control gates 232a, 232b from the floating gates 222a, 222b. The control gates 232a, 232b are, for example, polysilicon, and the control gate dielectrics are, for example, an ONO dielectric.

The pair of memory cell device 214a, 214b also share an erase gate 234. The erase gate 234 is arranged over the common source/drain region 218, and is spaced apart therefrom by a dielectric region. The erase gate 234 is, for example, polysilicon.

In some embodiments, a top gate surface of the memory device 202 in memory region 204 is co-planar with a top gate surface of transistor 206. For example, in some embodiments, a top surface of a word line 224a, 224b is co-planar with a top surface of metal gate 140, while in other embodiments a top surface of erase gate 234 and/or control gate 232a, 232b is co-planar with the top gate surface of transistor 206. It will be appreciated that in some embodiments, control gate 232a, 232b, erase gate 234, and/or word line 224a, 224b may include conductive or non-conductive capping structures that establish their respective top gate surfaces. For example, FIG. 2 shows an example where capping structures 236a, 236b, such as nitride capping structures, are arranged over the control gates 232a, 232b.

Figure 3:
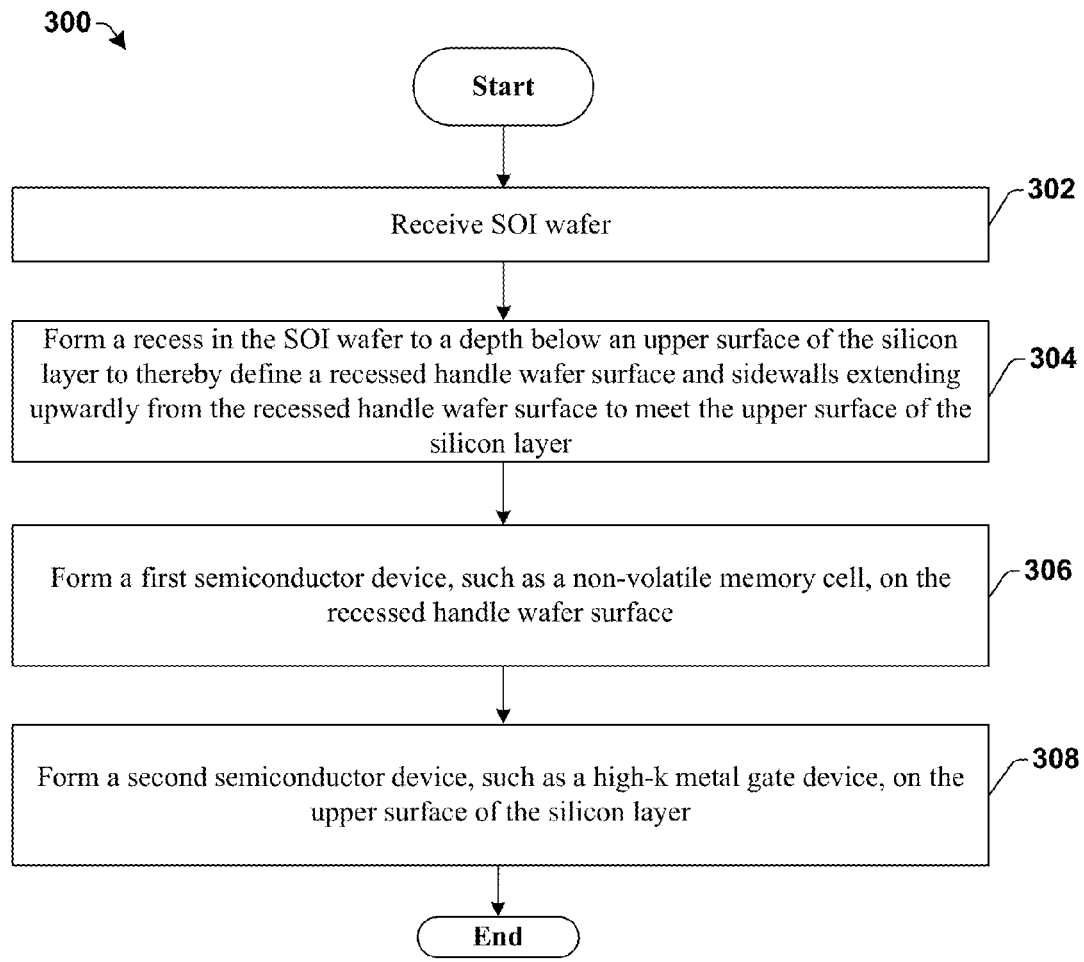
FIG. 3 shows an example of a method in flowchart format in accordance with some embodiments of the present disclosure.

With reference to FIG. 3, a flow chart 300 of some embodiments of the present disclosure. At 302, an SOI wafer is provided. The SOI wafer is made up of a handle wafer, an oxide layer arranged over the handle wafer, and a silicon layer arranged over the oxide layer. At 304, a recess is formed in the SOI wafer to a depth below an upper surface of the silicon layer. This recess defines a recessed handle wafer surface and sidewalls extending upwardly from the recessed handle wafer surface to meet the upper surface of the silicon layer. At 306, first semiconductor device, such as a non-volatile memory cell, is formed on the recessed handle wafer surface. At 308, a second semiconductor device, such as a high-k metal gate device, is formed on the upper surface of the silicon layer.

While the disclosed methods (e.g., the methods described by the flowchart 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. For instance, the high-k metal gate device can be formed prior to the non-volatile memory cell and/or can be formed prior to formation of the recess in the SOI wafer. In addition, not all illustrated acts may be required to implement one or more aspects or embodiments of the description herein. Further, one or more of the acts depicted herein may be carried out in one or more separate acts and/or phases.

With reference to FIGS. 4-15, a series of cross sectional views of some embodiments of the semiconductor structure at various stages of manufacture are provided to illustrate an example manufacturing flow. Although FIGS. 4-15 are described in relation to the method 300, it will be appreciated that the structures disclosed in FIGS. 4-15 are not limited to the method, but instead may stand alone as structures independent of the method. Similarly, although the method is described in relation to FIGS. 4-15, it will be appreciated that the method 300 is not limited to the structures disclosed in FIGS. 4-15, but instead may stand alone independent of the structures disclosed in FIGS. 4-15.

Figure 4:
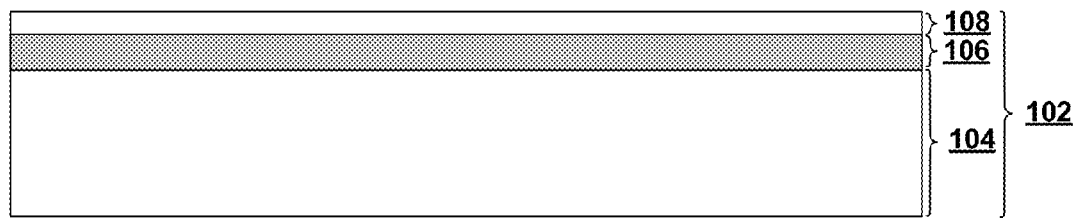
FIGS. 4-15 depict a series of incremental manufacturing steps as a series of cross-sectional views, which are consistent with some implementations of FIG. 3's flowchart.

FIG. 4 illustrates a cross sectional view 400 of some embodiments corresponding to Action 302 of FIG. 3. As shown by FIG. 4, an SOI substrate 102 is received. The SOI substrate 102 includes a device handle wafer 104, an insulating layer 106 over the handle wafer 104, and a high-quality device layer 108 over the insulating layer 106. The silicon device layer 108 is relatively thin, for example, from a few hundred Angstrom to several microns thick. The insulating layer 106, usually made of silicon dioxide and referred to as the "buried oxide" or "BOX", is usually a few thousand Angstroms thick. The handle wafer 104 can be a traditional bulk silicon wafer having a thickness for example, of around 0.75 mm. Building circuits on SOI substrates allows for more compact chip designs, resulting in smaller IC devices (with higher production yield) and more chips per wafer (increasing fab productivity).

Figure 5:
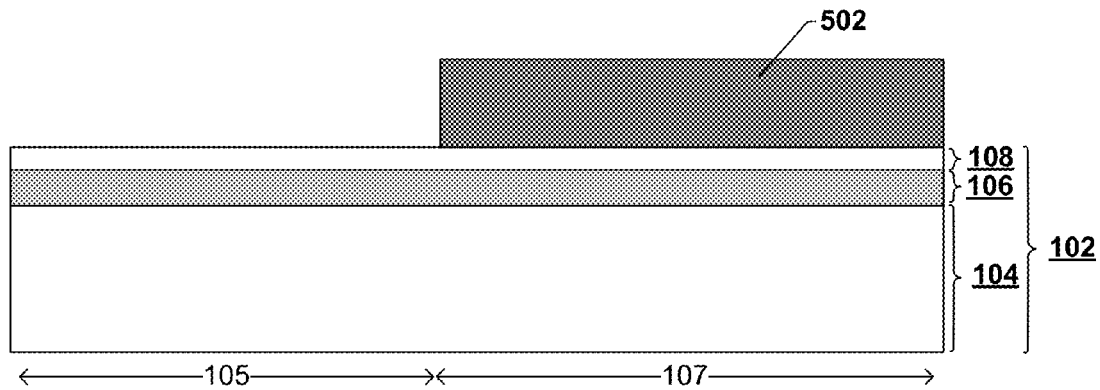

In FIG. 5, a memory region mask 502 is formed over the SOI substrate 102 to expose a memory region 105 while covering a logic region 107. In some embodiments, the memory region mask 502 is a photoresist mask, which is formed by applying (e.g., spinning on) a layer of photoresist and then using photolithography techniques to selectively expose the layer of photoresist to light and develop the selectively exposed photoresist layer to provide the mask 502. In other embodiments, the mask can be made of nitride, oxide-nitride, or some other layer and/or combination of layers.

Figure 6:
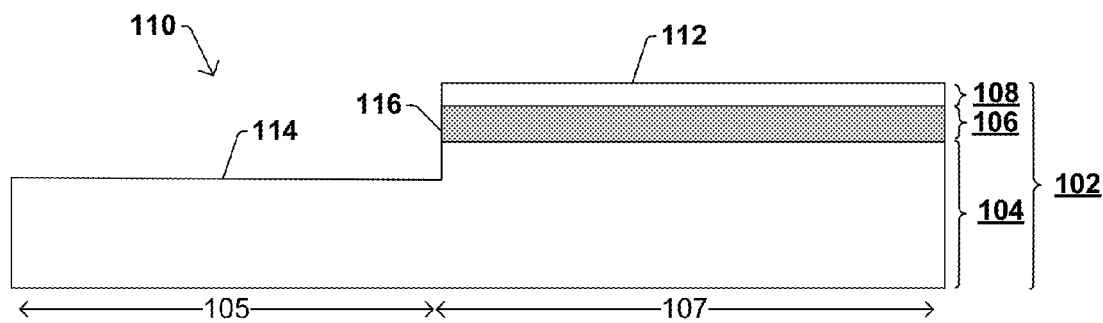

In FIG. 6, which corresponds to one example of 304 in FIG. 3, an etch process is carried out with the memory region mask 502 in place, thereby forming a recess 110 in the memory region 105. The recess 110 extends downward from an upper device layer surface 112 and defines a recessed handle wafer surface 114 and sidewalls 116, which extend upwardly from the recessed handle wafer surface 114 to meet the upper silicon layer surface 112. For example, in some embodiments, the recess can extend from approximately 100 angstroms to approximately 300 angstroms beneath the surface of the handle wafer. The etch can be a wet etch, such as an etch using hydrofluoric acid, or a dry etch, such as a plasma etch, or combinations thereof. Preferably, the etch is anisotropic, resulting in vertical or substantially vertical sidewalls 116; however, the etch can also have isotropic characteristics, resulting in slight rounding of the sidewalls 116 and/or recessed handle wafer surface 114. Advantageously, an anisotropic etch results in a substantially planar recessed handle wafer surface 114 which is well suited to form memory devices thereon. In some embodiments, the memory mask 502 can be removed after the etch is carried out to result in the illustrated structure.

Figure 7:
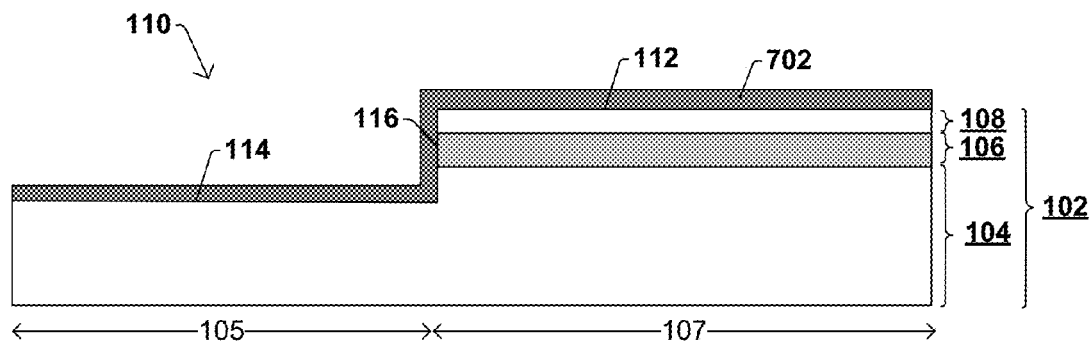

In FIG. 7, an oxidation is performed to repair damage from the etch process of FIG. 6. The oxidation can form a conformal oxide layer 702 over the upper silicon layer surface 112, recessed handle wafer surface 114, and sidewalls 116. The oxidation can be a high-temperature oxidation performed in an oxidation furnace, for example at temperatures between 800° C. and 1200° C. This conformal oxide layer is often removed during subsequent processing.

Figure 8:
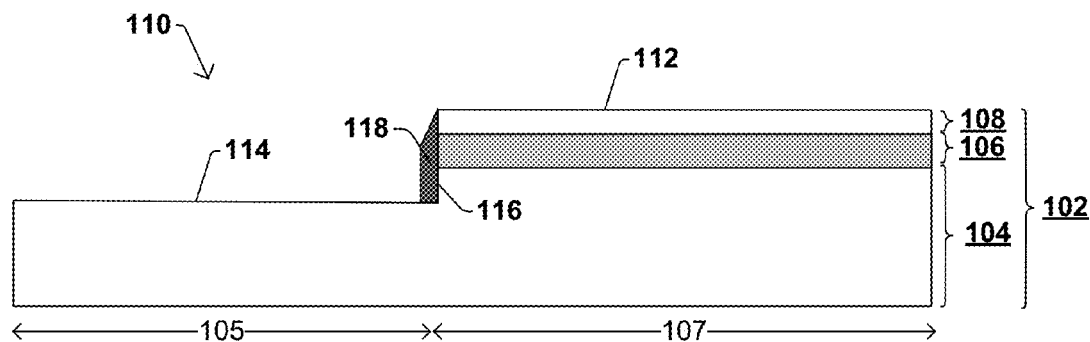

In FIG. 8, the conformal oxide layer 702 has been removed and a protective sidewall spacer 118 is formed on the recess sidewalls 116. In some embodiments, the protective sidewall spacer 118 is formed by forming a conformal protective dielectric liner over upper silicon layer surface 112, recessed handle wafer surface 114, and sidewalls 116. This conformal protective dielectric liner can be made of a nitride, such as silicon nitride (SiN) or titanium nitride (TiN), but can also be made of an oxide, such as silicon dioxide, or some other dielectric. The conformal protective dielectric liner can be formed, for example, by physical vapor deposition (PVD), chemical vapor deposition (CVD), plasma-enhanced chemical vapor deposition (PECVD), or atomic layer deposition (ALD). The protective conformal dielectric layer 702 can have a thickness ranging from approximately 20 nm to approximately ~1000 nm in some embodiments. This protective conformal protective dielectric liner can then be selectively removed via an anisotropic etch to form the protective sidewall spacer 118. In FIG. 8, for example, an anisotropic etch has been carried out to remove the conformal dielectric liner from the upper silicon layer surface 112 and the recessed handle wafer surface 114, thereby leaving a protective sidewall spacer 118 on the sidewalls of the recess 110. The anisotropic etch is typically a dry etch, such as a plasma etch.

Figure 9:
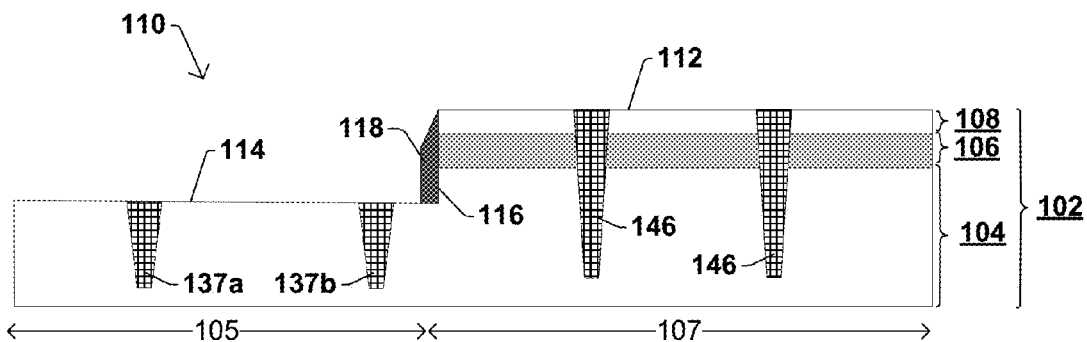

In FIG. 9, isolation structures 137a, 137b, and 146 can be formed in the SOI wafer. In particular, in FIG. 9's example, shorter isolation structures 137a, 137b are formed in the memory region 105 of the handle wafer 104; and taller isolation structures 146 are formed in the logic region 107 of the SOI wafer. The taller isolation structures 146 extend downward through the silicon layer 108 and buried insulator layer 106 and into the handle wafer 104. In some implementations, the isolation structures 137a, 137b, and 146 are made by forming trenches in the SOI wafer 102, and subsequently filling the trenches with an insulating material, such as an oxide or other dielectric. In other implementations, the isolation structures 137a, 137b, and 146 are made by implanting ions having an opposite doping type of the surrounding SOI wafer 102, such that the implanted isolation structures limit current leakage between devices. Note that although the illustrated manufacturing flow of FIGS. 4-15 show the isolation structures being formed after the recess 110 and protective sidewall spacer 118 are formed, in other implementations the isolation structures can be formed prior to formation of the recess 110. In this alternative implementation, the lower surfaces of the isolation structures often have the same depth, whereas the lower surfaces of the illustrated isolation structures have different depths.

Figure 10:
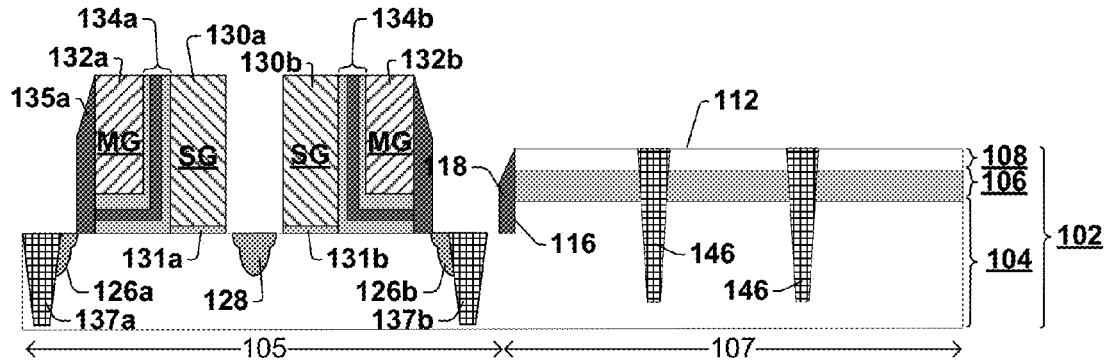

In FIG. 10, which corresponds to one example of block 306 of FIG. 3, a memory device is formed on the recessed handle wafer surface 114. In the example of FIG. 10, the memory device includes individual source/drain regions, and a common source/drain region, as well as memory gates, select gates, and charge trapping layers, such as previously described with regards to FIG. 1.

Figure 11:
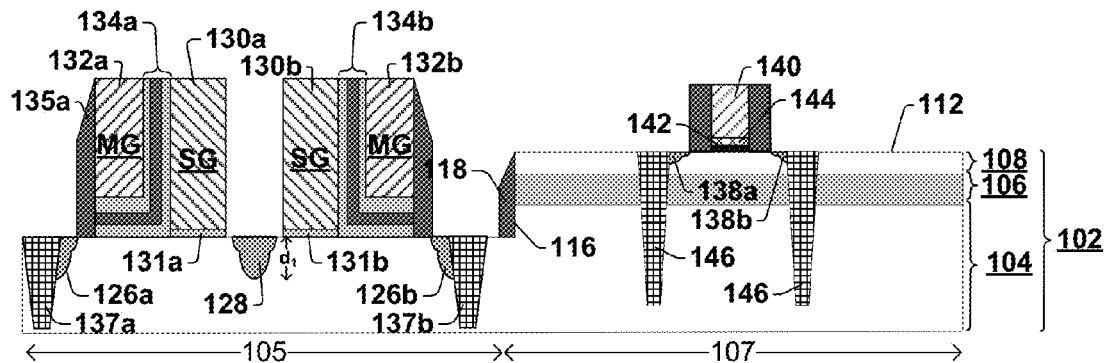

In FIG. 11, which corresponds to one example of block 308 of FIG. 3, a high-k metal gate (HKMG) device is formed on the upper silicon layer surface 112. In the example of FIG. 10, the illustrated second semiconductor device 122, which manifests as a high-k metal gate (HKMG) precursor, includes a pair of HKMG source/drain regions 138a, 138b; a sacrificial gate 140'; and a high k gate dielectric 142; similar to as previous described with regards to FIG. 1. The sacrificial gate 140' can be made of polysilicon in some embodiments.

Figure 12:
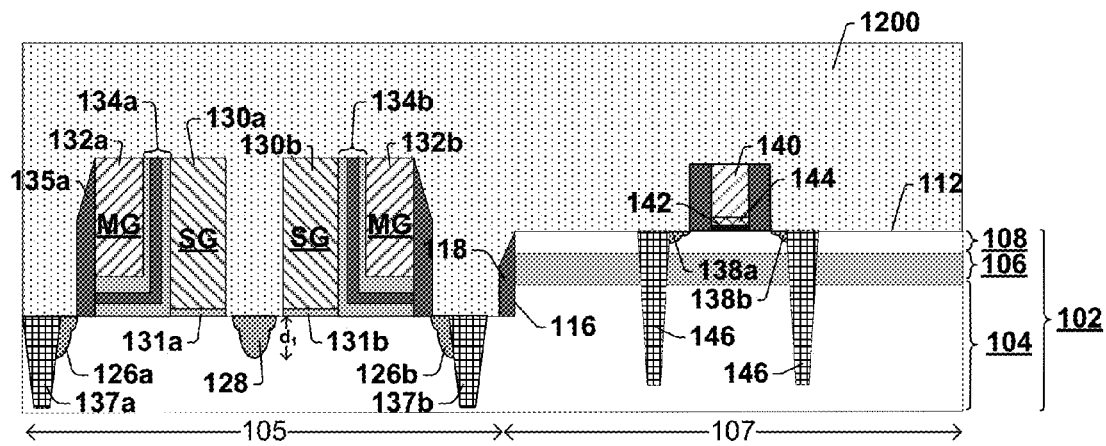

In FIG. 12, an interlayer dielectric (ILD) is formed over the structure. The interlayer dielectric can be an oxide, such as silicon dioxide, but is more often a low-k dielectric. Some non-limiting examples of low-k dielectric materials, include, but are not limited to: fluorine-doped silicon dioxide, carbon-doped silicon dioxide, porous silicon dioxide, porous carbon-doped silicon dioxide, spin-on organic polymer dielectrics, and spin-on silicon based polymeric dielectrics.

Figure 13:
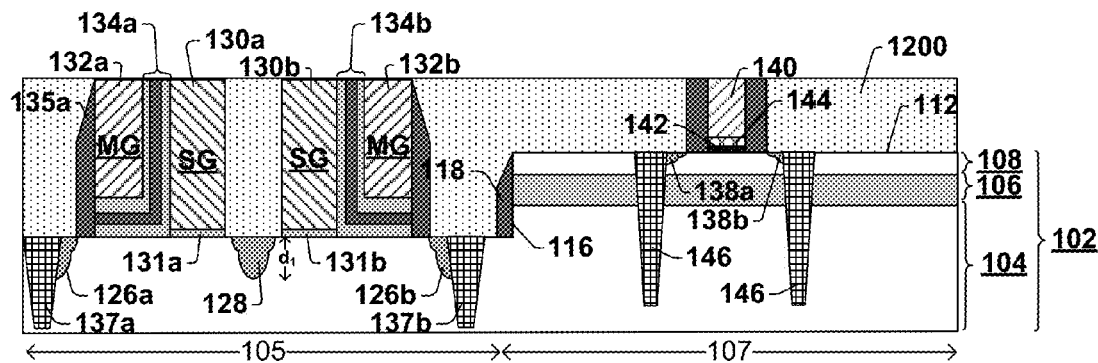

In FIG. 13, a chemical mechanical polishing (CMP) process is carried out to planarize a top surface of the structure. It is noted that although FIG. 13 shows an example, where the CMP process results in HKMG sidewall spacers having a planar top surface and memory sidewall spacers being left with non-planar, upper shoulders; in other embodiments both HKMG sidewall spacers and memory sidewall spacers can be left with planar top surfaces. In still other embodiments, the memory sidewall spacers can be left with planar top surfaces, while the HKMG sidewall spacers are left with non-planar, upper shoulders.

Figure 14:
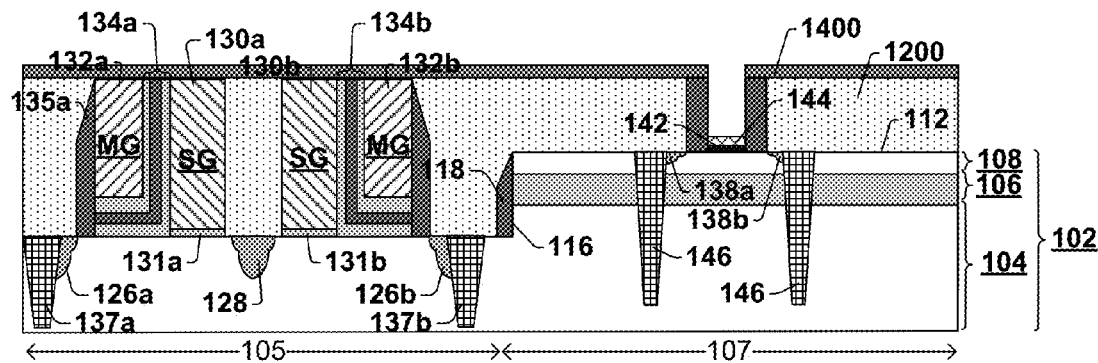

In FIG. 14, a protective mask, such as a patterned photoresist mask or hard mask for example, is formed over the structure so as to expose top surfaces of one or more sacrificial gates. With the protective mask in place, an etch is performed to remove the sacrificial gate and form a gate recess.

Figure 15:
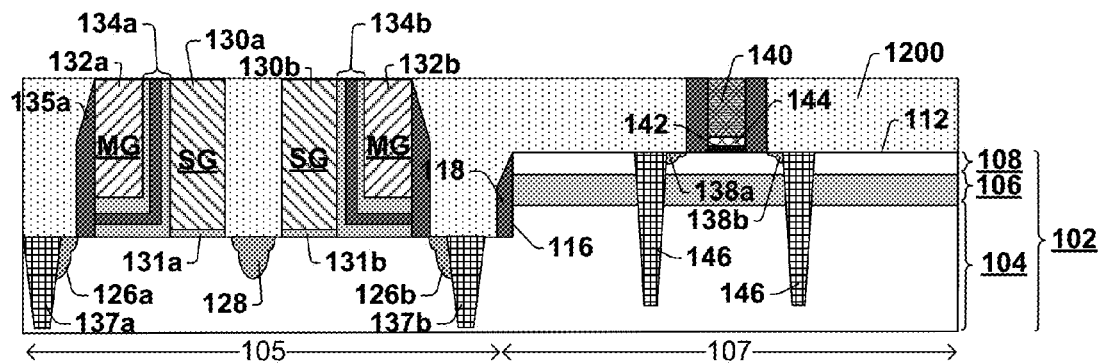

In FIG. 15, a metal gate is formed in the gate recess. In some embodiments, metal gates for NMOS and PMOS devices can be removed and/or formed separately, and can be formed of metals with different workfunctions to achieve suitable functionality. After the metal gates are formed, another CMP operation can be performed so a top surface of the HKMG metal gate is co-planar with a top surface of the SG 130a'/130b' and/or a top surface of the MG 132a', 132b'

Thus, as can be appreciated from above, some embodiments of the present disclosure provide an integrated circuit arranged on a silicon-on-insulator (SOI) substrate region. The SOI substrate region is made up of a handle wafer region, an oxide layer arranged over the handle wafer region, and a silicon layer arranged over the oxide layer. A recess extends downward from an upper surface of the silicon layer and terminates in the handle wafer region, thereby defining a recessed handle wafer surface and sidewalls extending upwardly from the recessed handle wafer surface to meet the upper surface of the silicon layer. A first semiconductor device is disposed on the recessed handle wafer surface. A second semiconductor device is disposed on the upper surface of the silicon layer.

Other embodiments relate to an integrated circuit (IC) disposed on a silicon-on-insulator (SOI) substrate region. The SOI substrate region is made up of a handle wafer region, an oxide layer arranged over the handle wafer region, and a silicon layer arranged over the oxide layer. A recess extends downward from an upper surface of the silicon layer and terminates in the handle wafer region, thereby defining a recessed handle wafer surface and sidewalls extending upwardly from the recessed handle wafer surface to meet the upper surface of the silicon layer. The recessed handle wafer surface corresponds to a memory region where an array of memory cells is arranged. The upper surface of the silicon layer corresponds to a logic region where a memory array control circuit is arranged.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a semiconductor on-insulator (SOI) substrate region made up of a handle substrate region, an insulating layer arranged over the handle substrate region, and a semiconductor layer arranged over the insulating layer;
   a recess extending downward from an upper surface of the semiconductor layer and terminating in the handle substrate region, thereby defining a recessed handle substrate surface and sidewalls extending upwardly from the recessed handle substrate surface to meet the upper surface of the semiconductor layer;
   a first semiconductor device disposed on the recessed handle substrate surface, the first semiconductor device including a first gate having a lowermost gate surface which is arranged at a first height below a second height of a lowermost surface of the insulating layer; and
   a second semiconductor device disposed on the upper surface of the semiconductor layer.

2. The IC of claim 1, the first gate having a first gate top surface and wherein the second semiconductor device includes a second gate having a second gate top surface, wherein the first gate top surface is co-planar with the second gate top surface.

3. The IC of claim 1, further comprising: a dielectric spacer arranged on the sidewalls of the recess and extending vertically from over the recessed handle substrate surface past the insulating layer and alongside the semiconductor layer.

4. The IC of claim 3, wherein a lowermost surface of the dielectric spacer directly contacts the recessed handle substrate surface and an uppermost portion of the dielectric spacer corresponds to the upper surface of the semiconductor layer.

5. The IC of claim 1, wherein the first semiconductor device is a non-volatile memory device and the second semiconductor device is a high-k metal gate device.

6. The IC of claim 5, wherein the non-volatile memory (NVM) device comprises:
   a pair of NVM source/drain regions spaced apart from one another in the handle substrate;
   a select gate (SG) disposed over the recessed handle substrate surface between the pair of NVM source/drain regions;
   a memory gate (MG) disposed between a SG sidewall and one of the NVM source/drain regions of the pair; and
   a charge trapping layer arranged between neighboring sidewalls of the MG and the SG and extending under the MG to separate the MG from the recessed handle substrate surface.

7. The IC of claim 5, wherein the high-k metal gate (HKMG) device comprises:
   a pair of HKMG source/drain regions spaced apart from one another in the semiconductor layer; and
   a metal gate disposed over the semiconductor layer and arranged between the pair of HKMG source/drain regions.

8. The IC of claim 7, wherein the non-volatile memory (NVM) device comprises:
   a pair of NVM source/drain regions spaced apart from one another in the handle substrate;
   a select gate (SG) disposed over the recessed handle substrate surface between the pair of NVM source/drain regions;
   a memory gate (MG) disposed between a SG sidewall and one of the NVM source/drain regions of the pair; and
   a charge trapping layer arranged between neighboring sidewalls of the MG and the SG and extending under the MG to separate the MG from the recessed handle substrate surface.

9. The IC of claim 8, wherein a top surface of the metal gate of the HKMG device is co-planar with a top surface of the SG or MG of the NVM device.

10. The IC of claim 8, wherein the NVM source/drain regions have a first implant depth and the HKMG source/drain regions have a second implant depth that is greater than the first implant depth.

11. The IC of claim 10, wherein the first implant depth, as measured between the recessed surface and a lower portion of the NVM source/drain regions, is greater than a thickness of the semiconductor layer, as measured between the upper surface of the semiconductor layer and an uppermost surface of the insulating layer.

12. The IC of claim 1, wherein the first semiconductor device comprises:
   a pair of non-volatile memory (NVM) source/drain regions spaced apart from one another in the handle substrate region;
   a select gate (SG) disposed over the recessed handle substrate surface between the pair of NVM source/drain regions;
   a memory gate (MG) disposed between a SG sidewall and one of the NVM source/drain regions of the pair; and
   a charge trapping layer arranged between neighboring sidewalls of the MG and the SG and extending under the MG to separate the MG from the recessed handle substrate surface.

13. The IC of claim 12, wherein a lowermost surface of the SG is arranged at a first height which is below a second height of a lowermost surface of the insulating layer.

14. The IC of claim 12, wherein at least a portion of the charge trapping layer is arranged at a first height which is below a second height of a lowermost surface of the insulating layer.

15. An integrated circuit (IC) comprising:
 a semiconductor on-insulator (SOI) substrate region made up of a handle substrate region, an insulating layer arranged over the handle substrate region, and a semiconductor layer arranged over the insulating layer;
 a recess extending downward from an upper surface of the semiconductor layer and terminating in the handle substrate region, thereby defining a recessed handle substrate surface and sidewalls extending upwardly from the recessed handle substrate surface to meet the upper surface of the semiconductor layer; and
 a semiconductor device including a gate electrode having a lowermost gate surface which is arranged at a first height below a second height of a lowermost surface of the insulating layer;
 wherein the recessed handle substrate surface corresponds to the semiconductor device and a memory region where an array of memory cells are arranged and wherein the upper surface of the semiconductor layer corresponds to a logic region where a memory array control circuit is arranged.

16. The IC of claim 15, wherein the memory cells are non-volatile memory cells and the memory array control circuit includes a high-k metal gate device.

17. The IC of claim 15, wherein a memory cell includes:
 a select gate (SG) and a memory gate (MG) that each comprise poly silicon or metal;
 a charge trapping layer separating the SG and MG, the charge trapping layer comprising:
  an oxide-nitride-oxide (ONO) layer; or
  an arrangement of substantially spherical silicon nanocrystals arranged between a tunnel oxide layer and a control oxide layer.

18. The IC of claim 15, wherein the recess has a depth ranging from approximately 30 nm to 1000 nm.

19. The IC of claim 15, further comprising: a dielectric spacer arranged on the sidewalls of the recess and extending vertically from over the recessed handle substrate surface past the insulating layer and alongside the semiconductor layer, wherein the spacer comprises a continuous nitride structure or a multi layer nitride-oxide-nitride (NON) structure.

20. An integrated circuit (IC) comprising:
 a semiconductor-on-insulator (SOI) substrate region made up of a handle substrate region, an insulating layer arranged over the handle substrate region, and a semiconductor layer arranged over the insulating layer;
 a recess extending downward from an uppermost surface of the semiconductor layer and terminating in the handle substrate region, thereby defining a recessed handle substrate surface and inner sidewalls extending upwardly from the recessed handle substrate surface to meet the uppermost surface of the semiconductor layer;
 a first semiconductor device disposed on the recessed handle substrate surface the first semiconductor device including a first gate having a lowermost gate surface which is arranged at a first height below a second height of a lowermost surface of the insulating layer;
 a second semiconductor device disposed on the upper surface of the semiconductor layer; and
 a dielectric spacer arranged on the inner sidewalls and extending vertically from over the recessed handle substrate surface past the insulating layer and alongside the semiconductor layer, wherein a lowermost surface of the dielectric spacer directly contacts the recessed handle substrate surface, and wherein an uppermost portion of the dielectric spacer corresponds to the uppermost surface of the semiconductor layer.

* * * * *